(12) United States Patent
Jung et al.

(10) Patent No.: US 6,396,933 B1
(45) Date of Patent: May 28, 2002

(54) HIGH-FIDELITY AND HIGH-EFFICIENCY ANALOG AMPLIFIER COMBINED WITH DIGITAL AMPLIFIER

(75) Inventors: Nam-Sung Jung, Wonjoo-shi; Gyu-Hyeong Cho, Daejeon-shi, both of (KR)

(73) Assignee: Korea Advanced Institute of Science and Technology, Daejeon-shi (KR)

( * ) Notice: Subject to any disclaimer, the term of this patent is extended or adjusted under 35 U.S.C. 154(b) by 0 days.

(21) Appl. No.: 08/937,971

(22) Filed: Sep. 25, 1997

(30) Foreign Application Priority Data

Feb. 24, 1997 (KR) ............................................... 97-5529

(51) Int. Cl.[7] .............................. H04R 3/00; H03F 3/38; H03F 3/68
(52) U.S. Cl. ..................... 381/96; 381/116; 381/117; 330/10; 330/124; 330/207 A
(58) Field of Search ......................... 381/96, 120, 116, 381/117; 330/10, 124, 207 A

(56) References Cited

U.S. PATENT DOCUMENTS

| | | | |
|---|---|---|---|
| 4,107,619 A | * 8/1978 | Pass | 330/255 |
| 4,600,891 A | * 7/1986 | Taylor et al. | 330/10 |
| 4,649,565 A | * 3/1987 | Kaizer et al. | 81/90 |
| 5,031,500 A | * 7/1991 | Koike et al. | 381/96 |
| 5,068,903 A | * 11/1991 | Walker | 381/96 |
| 5,070,308 A | * 12/1991 | Padi | 330/268 |
| 5,218,315 A | * 6/1993 | Turner | 330/207 A |
| 5,278,977 A | * 1/1994 | Martin | 330/127 |
| 5,302,912 A | * 4/1994 | Grant | 330/118 |
| 5,389,829 A | * 2/1995 | Milazzo | 330/10 |
| 5,410,592 A | * 4/1995 | Wagner et al. | 330/251 |
| 5,625,698 A | * 4/1997 | Barbetta | 381/96 |
| 5,677,962 A | * 10/1997 | Harrison et al. | 381/109 |
| 5,764,781 A | * 6/1998 | Ding | 381/96 |
| 5,923,217 A | * 7/1999 | Durec | 330/288 |

OTHER PUBLICATIONS

Walter G. Jung, 1974 and 1980, IC Op–Amp Cookbook, Howard W. Sams & Co., Inc., pp. 184–185.*

* cited by examiner

Primary Examiner—Forester W. Isen
Assistant Examiner—Laura A. Grier
(74) Attorney, Agent, or Firm—Dilworth & Barrese LLP.

(57) ABSTRACT

This invention provides an analog audio amplifier having both excellent linearity and high efficiency, which is combined with digital amplifier. The analog-digital combined amplifier comprises a class A, class B or class AB type analog amplifier serving as an independent voltage source; and a class D type digital amplifier serving as a dependent current source in which the analog amplifier and the digital amplifier are connected to each other.

13 Claims, 7 Drawing Sheets

HIGH-FIDELITY AND HIGH-EFFICIENCY ANALOG AMPLIFIER COMBINED WITH DIGITAL AMPLIFIER

FIELD OF THE INVENTION

This invention relates to an amplifier, more particularly to an analog audio amplifier having both excellent linearity and high efficiency, which is combined with digital amplifier.

BACKGROUND OF THE INVENTION

A conventional analog audio amplifiers such as class A, class B or class AB, based on the linear circuit technology, have very excellent distortion characteristics, but show considerably poor efficiency and bulky volume. On the other hand, the class D type digital amplifier, which adopt a pulse width modulation(PWM) switching, has high efficiency and small volume but relatively bad fidelity.

To date with the event of so-called Green Round, particularly in electronic products including audio amplifiers, it is necessary that the higher efficiency technology should be developed in order to reduce the loss of energy.

Conventionally, in the audio amplifier, the most important factor on the product's design was the linearity rather than the efficiency under the circumstances which have no particular interest in power loss or due to the technical difficulty. As a result, almost all the amplifiers for audio amplifier application till now are based on the analog linear circuit having an excellent distortion property.

However, although audio amplifiers which adopt class A, class B or class AB circuit have excellent linear characteristics as discussed above, it inevitably causes a large quantity of power loss in the high power amplifier. Therefore, in the typical analog audio amplifiers, since the most of output except for the energy converted to the audio sound is converted to a thermal energy and dissipated, this results in the temperature increase of the power transistor groups composed of bipolar transistors, field effect transistors, etc., requiring massive heat sink made of metals such as aluminum, copper, etc. or noisy fan for cooling, and thus undesirably increasing size and weight of the power amplifier system. As is generally known, since class A amplifier always operates in the active region, it simultaneously has merit and demerit of the most excellent distortion characteristics and the worst efficiency.

Thus, it would be desirable to provide an amplifier having both excellent linearity and high efficiency, which are difficult to be compatible. To solve this problem, class B type amplifiers composed of so-called push-pull circuit has been studied so far. The push-pull circuit includes a pair of transistors connected to each other in the emitter-follower fashion, which is very useful for energy saving. A high efficiency up to maximum 78.5% can be theoretically obtained, but undesirable crossover distortion problem between two transistors in the small signal level still persists. Additionally, in the class B type amplifiers, although the crossover distortion in the small signal level can be somewhat improved by applying a proper negative feedback, it is impossible to satisfactorily eliminate total harmonic distortion(i.e., THD) under the application of high voltage and flow of large amount of current. The reason why is that the two transistors constituting the class B type amplifiers are alternatively turned-on and turned-off and therefore allow easy switching into the turn-on and turn-off in the small signal level, but it is difficult to perform rapidly the switching operation owing to the charge storage effect in transistors when a large amount of current flows, resulting in degradation of the total harmonic distortion.

On the other hand, the class AB type amplifier, which has its load curve between class A and class B, allows small amount of current to flow even when no signal is applied. This amount of current is smaller than that of the class A type amplifier but remarkably larger than that of the class B type amplifier. In the class AB type amplifier, as the bias current increases, linear characterics thereof approaches to the class A, whereas as the bias current decreases, it approaches to the class B.

A simple analog audio amplifier to which negative feedback is applied will be described with reference to FIG. 1.

As well known, in class A, B or AB amplifier, about 21.5% to about 75% of supplied energy is dissipated as a thermal energy, and thus it is necessary for a large aluminum heat sink or noisy fan for cooling, mounted within the enclosure in which various devices are mounted. Therefore, such amplifiers have drawbacks of not only considerably poor efficiency and bulky volume, which are peculiar to typical class A, B or AB amplifier, but also incurring noise when driving the cooling fan. In particular, when such amplifiers are operated in the closed space such as vehicle, the characteristics of various devices including power transistors can be deteriorated due to poor radiation of heat within the enclosure, resulting in shortening of the life cycle in audio equipment.

Accordingly, an audio amplifier having both of a high fidelity and a high efficiency is strongly demanded.

This requirements can be solved by the present invention which provides the analog amplifier mixed with class D type digital amplifier having high efficiency and small volume.

The class D type digital amplifier adopts the pulse width modulation(PWM) switching scheme which performs amplifying function by switching operation other than linear operation. It is generally known that the class D type digital amplifier has a high efficiency and small volume but relatively bad fidelity. In the class D type digital amplifier, the gate signals of power transistors, used as control pulses, are generated by comparing the carrier signal of saw tooth wave with the control reference signal of error signal of audio signal.

The nonlinearity due to distortion inevitably caused in class D type digital amplifier should be corrected through precise negative feedback technology to meet the acoustic fidelity required for audio equipment.

The operating principle of class D type digital amplifier is identical with that of switching regulator or pulse width modulation(PWM) converter, except that class D type digital amplifier for audio equipment has wider bandwidth ranging about 20 Hz to 20 kHz, which covers the audible frequency band, compared with the switching regulator or PWM converter.

The class D type amplifier is generally provided with high power field effect transistors(FETs) as power switching device, and is possible to obtain the efficiency of 100% in theory, but, in fact, of about 90% due to thermal loss generated in proportion to the switching frequency and the power loss in various control circuits.

Since such class D type amplifier is very poor in distortion characteristics, to ensure the sound quality needed in acoustic equipments, it is necessary to design the precise feedback circuit. Generally, in acoustic equipment provided with class D type amplifier, the digital circuit block which performs amplifying operation by utilizing PWM type switching is mixed with the analog circuit block, bring about a large amount of switching noise in the circuit. Thus, it is difficult to design the negative feedback circuit with sufficient stability. Additionally, in case that the negative feedback circuit is erroneously designed, it may cause undesirable oscillation, often resulting in critical damage to the circuit block.

As one example of prior art for removal such disadvantages in class D type amplifier, there has been known "Triple loop negative feedback audio amplifier" (Korean patent application No.96-37905), applied by the present inventors. This triple loop negative feedback audio amplifier show very low distortion characteristics of about 0.1%, compared with the conventional class D amplifier, while maintaining the high efficiency and the high power.

Unfortunately, audio amplifiers which have been developed till now are constructed to have only one characteristic of a high fidelity and a high efficiency, depending on their using purpose.

Accordingly, there exists a need for an audio amplifier simultaneously having excellent distortion characteristics and high efficiency.

SUMMARY OF THE INVENTION

It is the general object of this invention to provide an analog amplifier simultaneously having a high fidelity and a high efficiency with aid of digital amplifier.

In order to achieve the above object, the analog-digital combined amplifier according to the present invention comprises a class A, class B or class AB type analog amplifier serving as the independent voltage source, and a class D type digital amplifier serving as a dependent current source thereof, which are connected to each other.

According to one embodiment of the present invention, the analog-digital combined amplifier further comprises a sensing circuit for sensing a small amount of current output from the analog amplifier and generating a sense voltage to allow the digital amplifier to supply a large amount of current.

According to another embodiment of the present invention, said analog amplifier comprises a basic amplifier; a base driver for controlling the operation of transistors; a pair of transistors constituting the push-pull stage; and a feedback means composed of passive elements for determining the closed-loop gain of a whole system.

According to still another embodiment of the present invention, said digital amplifier comprises a comparator; a plurality of resistors for determining the hysteresis voltage of said comparator and a pull-up resistor; a gate driver; a pair of high power switches constituting output stage; and an inductor.

According to still another embodiment of the present invention, said inductor has a value which is in range of about 10 µH to about 500 µH.

According to still another embodiment of the present invention, said sensing block comprises a resistor for sensing the current supplied from the analog amplifier or absorbed thereto and converting it into the voltage component; and an amplifier for amplifying the voltage sensed by said resistor.

According to still another embodiment of the present invention, said sensing resistor has a value which is in range of about 0.01Ω to about 10Ω.

BRIEF DESCRIPTION OF THE INVENTION

DESCRIPTION OF SPECIFIC EMBODIMENTS

Figure 1:
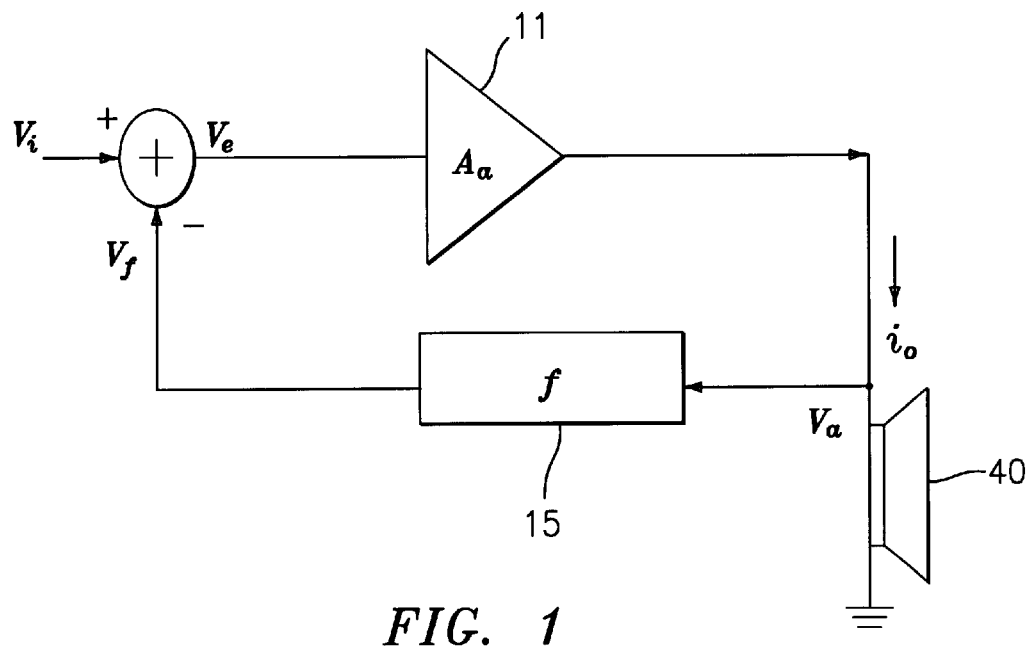
FIG. 1 is a block diagram showing a conventional analog amplifier.

According to the present invention, the digital amplifier having high efficiency characteristics is described in combination with the conventional analog audio amplifier having excellent distortion characteristics as shown FIG. 1, to obtain both of the excellent distortion characteristics and high fidelity.

The analog-digital combined audio amplifier according to the present invention will be described with reference to Figures.

Figure 2:
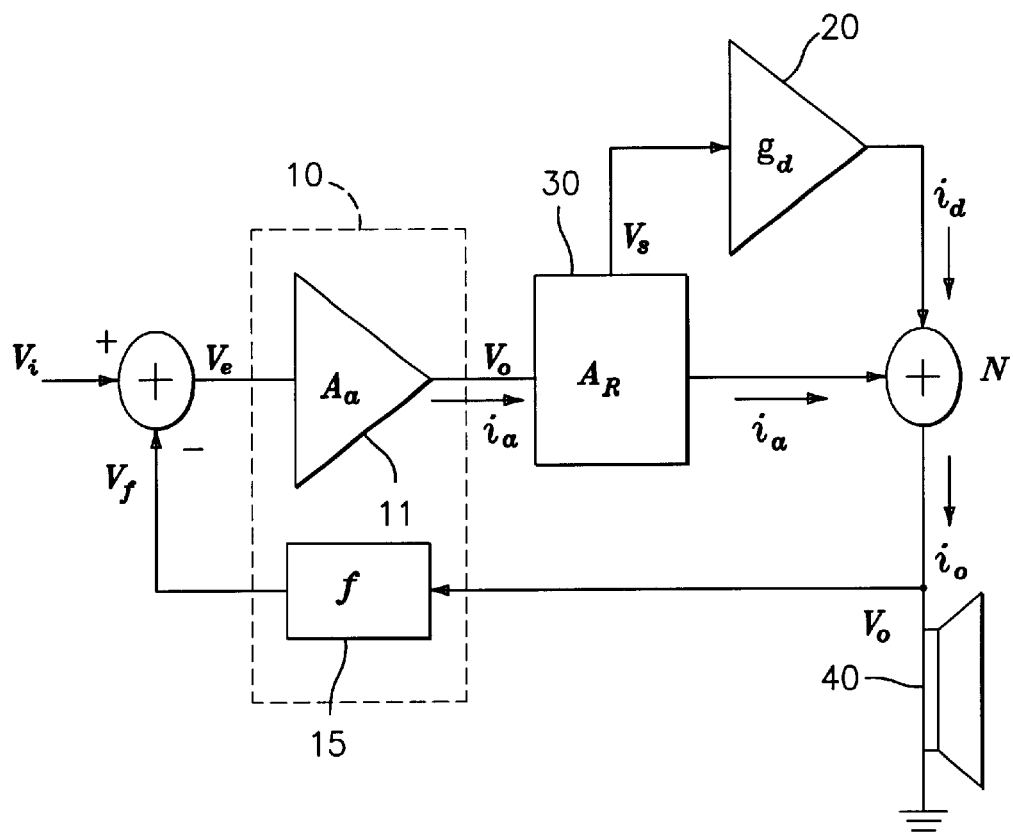
FIG. 2 is a block diagram showing an audio amplifier comprising analog amplifier combined with digital amplifier of one embodiment according to the present invention.

Referring to FIG. 2, the analog/digital combined amplifier according to the present invention is composed of four circuit sections, i.e., an analog amplifier 10 which serves as an independent voltage source, a digital amplifier 20 which serves as a dependent current source thereof, a sensing circuit 30 for sensing a small amount of current $i_a$ supplied by the analog amplifier 10 and generating a sense voltage $V_s$ to allow the digital amplifier 20 to supply a large amount of current $i_d$ and a speaker 40 for generating the audio sound.

Figure 3:
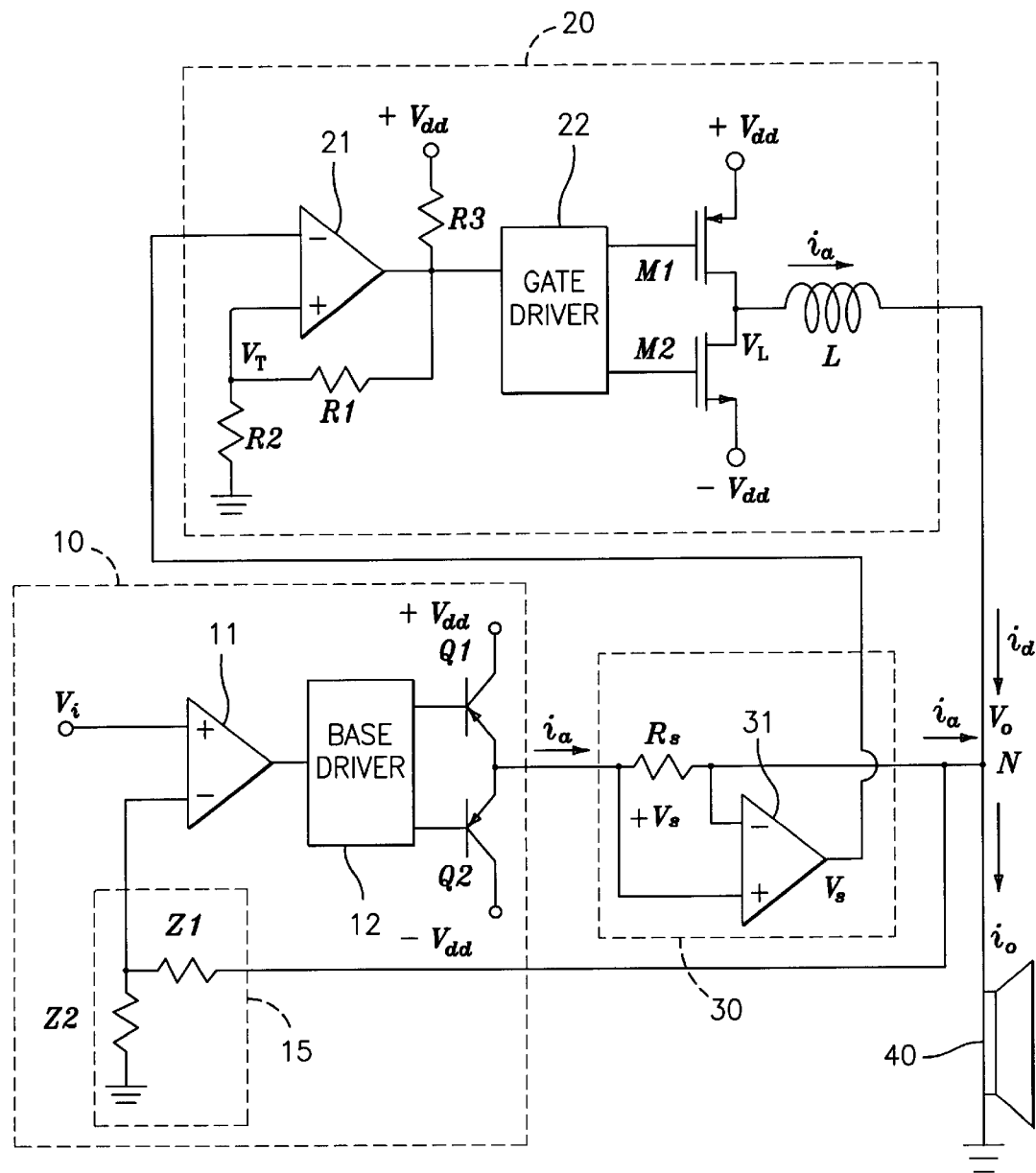
FIG. 3 is a detailed circuit diagram of the audio amplifier shown in FIG. 2.

The analog amplifier 10 includes a basic amplifier 11, a base driver 12 for controlling the operation of a pair of transistors Q1 and Q2 constituting a push-pull stage together; and a feedback means 15 composed of passive element Z1 and Z2 for determining the closed-loop gain of a whole system, as shown in FIG. 3.

On the other hand, the digital amplifier 20 includes a comparator 21, resistors R1, R2 and a pull-up resistor R3 for determining the hysteresis voltage of said comparator 21, a gate driver 22, a pair of high power switches M1 and M2 constituting output stage, and an inductor L.

The sensing circuit 30 has a resistor Rs for sensing the current supplied from the analog amplifier 10 or absorbed thereto and converting it into voltage $V_s'$; and an amplifier 31 for amplifying the voltage $V_s'$ sensed by said resistor to a amplified voltage Vs.

The operation of the analog/digital combined amplifier according to the present invention will be described.

The analog amplifier 10 acts as an independent voltage source, and generates only ripple current to compensate the distortion caused by the digital amplifier 20 to ensure high-fidelity.

Thus, even if the analog amplifier 10 is composed of class B circuit, since the current from the analog amplifier 10 to the speaker 40 is relatively smaller than that of conventional class B type amplifier which should supply the whole current, the distortion caused by class B type amplifier of the present invention 10 remarkably decreases from that of a conventional class B type amplifier.

The digital amplifier 20 acts as a dependent current source and supplies most of current $i_d$ of current $i_o$ needed in the speaker 40 and therefore higher efficiency characteristics can be obtained by this digital amplifier 20. It should be noted that there is no problem in the system stability because the digital amplifier 20 is a single first order system.

To rapidly absorb the ripple current generated by the inductor L in the digital amplifier 20, it is preferable that the bandwidth of analog amplifier 10 should be as wide as possible.

According to the present invention, since the analog amplifier 10 and the digital amplifier 20 serve as an independent voltage source and a dependent current source, respectively, the parallel linkage between analog amplifier 10 and digital amplifiers 20 gives no problem.

The basic principle of the present invention is that, when the current $i_a$ flows from the analog amplifier 10 which has excellent distortion characteristics but shows poor efficiency to speaker 40, the most of current $i_d$ of current $i_o$ needed in the speaker 40 is supplied from the digital amplifier 20 which has a high efficiency, while the analog amplifier 10 supplies only a small amount of ripple current or rapidly absorbs an excessive current $i_a$, so that high fidelity and high efficiency can be simultaneously obtained.

Now, the current flow from the respective amplifiers to the speaker 40 will be described with reference to FIG. 2.

In FIG. 2, reference numeral $i_o$ designates the current which flows to speaker 40; $i_a$ output current of the analog amplifier 10; $i_d$ output current of the digital amplifier 20; $g_d$ gain of the digital amplifier 20; $A_a$ gain of the basic amplifier 11 in the analog amplifier 10; and $A_R$ gain of the sensing circuit 30, respectively.

From FIG. 2, the following equation can be obtained:

$$i_o = i_a + i_d \qquad (1)$$

$$i_d = g_d V_s \qquad (2)$$

$$V_s = A_R i_a \qquad (3)$$

Substituting (3) into (2) makes $$i_d = g_d A_R i_a \qquad (4)$$

Again substituting (4) into (1), we obtain $$i_o = (1 + g_d A_R) i_a \qquad (5)$$

In the above equations, it is necessary to decrease the current $i_a$ but increase the current $i_d$ to ensure high efficiency because the analog amplifier is inferior to the digital amplifier in terms of efficiency. As apparent from the above equation, it is understood that when a certain current $i_o$ is to be obtained from FIG. 5, high efficiency can be obtained by increasing $g_d$ and $A_R$ to reduce current $i_a$.

When theoretically studying FIG. 5, as $g_d$ and $A_R$ become larger, $i_a$ can be reduced to almost zero, but, in fact, there exists a physical limit. In equation 5, when $g_d A_R$ becomes sufficiently larger than 1, it is possible to approach as the equation 6.

$$i_o \approx g_d A_R i_a \qquad (6)$$

According to the present invention, the $g_d A_R$ is possible to have a value as large several tens. The $g_d A_R$ can be easily adjusted by changing the value of $A_R$, the sensing resistor Rs and the inductor L.

As the value of the sensing resistor $R_s$ increases, the voltage supplied to the speaker decreases. Thus, it is preferable to have smaller value of the sensing resistor $R_s$, but, when this value is too small, it may cause the noise. Accordingly, the value of the sensing resistor $R_s$ in the present invention should be in the range of 0.01Ω to 10Ω.

When the value of the inductor is too small, a large amount of current abruptly flows and thus it may damage the high power switches or transistors Q1 and Q2, but when the value of inductor is excessively large close to the infinity($\infty$), the digital amplifier 20 may be neglected. Accordingly, in this embodiment of the present invention, inductor L has a value which is in the range of about 10 μH to about 500 μH.

Referring to FIG. 2, the process for determining the gain of voltage will be described.

In the following equation, $V_i$ and $V_o$ indicate input and output signals; $V_0'$ approximate value to $V_O$; f transfer function $V_f$ voltage fed-back to input side; $V_e$ differential voltage between $V_i$ and $V_f$, respectively. It is noted that the incoming and outgoing currents are same in the sensing circuit 30. For the easy analysis, assuming that the voltage drop across the sensing circuit 30 can be neglected, it follows that $$V_o \approx V_0' \qquad (7)$$

From FIG. 2, we obtain $$V_o = A_a V_e \qquad (8)$$

$$V_f = f V_0 \qquad (9)$$

$$V_e = V_i - V_f \qquad (10)$$

Substituting (9) into (10) makes $$V_e = V_i - f V_0 \qquad (11)$$

Substituting (11) into (8), we obtain $$V_0 = A_a V_i - A_a f V_0 \qquad (12)$$

From (12), we obtain $$V_0/V_i = A = A_a/(1 + A_a f) \qquad (13)$$

where, A, which is so-called the closed loop gain, is the overall gain in the above negative feedback system, and T which is the loop gain is given by $$T = A_a f \qquad (14)$$

Substituting (14) into (13) makes $$V_0/V_i = A = A_a/(1+T) = (1/f)(T/(1+T)) \qquad (15)$$

If T>>1, from (15), overall gain is given by $$A \approx 1/f \qquad (16)$$

For large value of loop gain T, the overall gain is purely determined by the feedback transfer function f.

Since the voltage series feedback is applied as shown in FIG. 3, the overall voltage gain can be given by the following equation (17) as impedance means Z1 and Z2 of the feedback means 15.

$$A \approx 1 + Z1/Z2 \qquad (17)$$

Next, the operation of the audio amplifier according to the present invention will be studied in detail with reference to FIG. 3.

The digital amplifier 20 has two switching modes. In the first switching mode, a high power switch M1 made of p-channel metal oxide semiconductor (PMOS) turns on, and a high power switch M2 made of n-channel metal oxide semiconductor(NMOS) turns off. While, in the second switching mode, the high power switch M1 turns off, and the high power switch M2 turns on.

First, let us assume that an input signal supplied to the analog amplifier 10 is the sinusoidal waveform and, now, is positively growing. When $V_i$ increases, the current $i_a$ output from the analog amplifier 10 also increases with proportion to the input signal $V_i$.

Since the current $i_a$ is fed to the speaker 40 via the resistor $R_s$ in the sensing circuit 30, increasing of $i_a$ gives the voltage drop $V_s'$ across the resistor $R_s$. The voltage drop $V_s'$ across the resistor $R_s$ is amplified to a voltage $V_s$ by the amplifier 31, then the voltage $V_s$ is fed to the inverting input terminal of comparator 21 in the digital amplifier 20. As the input voltage $V_i$ increases, when the output voltage $V_s$ of the sensing circuit 30 reaches $R_2(+V_{dd})/(R_1+R_2)=V_T(H)$, the output of comparator 21 is changed from $V_{dd}$ to $-V_{dd}$. Thus, the noninverting input terminal of comparator 21 is also changed to $R_2(-V_{dd})/(R_1+R_2)=V_T(L)$. The output $-V_{dd}$ of the comparator is the low level, and the voltage passing through the gate driver 22 also keeps the low level. Thus, high power switch M1 turns on and M2 turns off. Such switching state refers to the first switching mode.

During the first switching mode state, inductor current $i_d$ linearly increases with the approximate slope of $(+V_{dd}-V_0(t))/L$, where $V_0(t)$ represents the output current at the time instance t. As the current $i_d$ supplied from the digital amplifier 20 through the inductor L to the speaker 40 increases., the current $i_a$ supplied from the analog amplifier 10 decreases. The current $i_d$ supplied from the digital amplifier 20 keeps growing and flowing into the load along the same direction as the current $i_0$ needed in the speaker 40 until the current $i_a$ reaches up to zero. This means that all of current needed in the speaker 40 is supplied from the digital amplifier 20.

After the current $i_a$ supplied from the analog amplifier reaches to zero, the excess current supplied from the digital amplifier starts to flow into the analog amplifier and generates negative current $-i_a$ in the opposite direction to the current $i_a$. The negative current $-i_a$ flows into the analog amplifier via the resistor $R_s$, and thus the voltage drop across the resistor $R_s$ caused by negative current $-i_a$ makes the negative sensing voltage $-V_s'$. Thus, a negative voltage $-V_s$ is generated in the output of the amplifier 31 in the sensing circuit 30 by the sensing voltage $-V_s$, and is applied to the inverting input of the comparator 21.

Under the condition, since the hysteresis voltage $V_T$ keeps $R_2\cdot(-V_{dd})/(R_1+R_2)=V_T(L)$, when the negative voltage $-V_s$ applied to the inverting input of the comparator 21 becomes small than the $R_2\cdot(-V_{dd})/(R_1+R_2)=V_T(L)$ in the noninverting input, the output of the comparator 21 is changed from $-V_{dd}$ to $+V_{dd}$, so that the output of the comparator 21 is changed to high level, and thus switch M1 turns off and switch M2 turns on.

Now, the first switching mode ends and the second switching mode starts. During the second switching mode state, the current $i_d$ passing through inductor L decreases with the slope of $(-V_{dd}-V_0(t))/L$ and therefore the current $i_a$ supplied from the analog amplifier 10 also increases. As a result, the positive sensing voltage $+V_s$ is detected from the amplifier 31, when this voltage $+V_s$ reaches $V_T(H)$, the output of the comparator 21 is changed to low level $(-V_{dd})$, and the second switching mode ends and again the first switching mode starts.

Accordingly, both the high fidelity and the high efficiency can be guaranteed by the above mentioned two switching modes.

Figure 4:
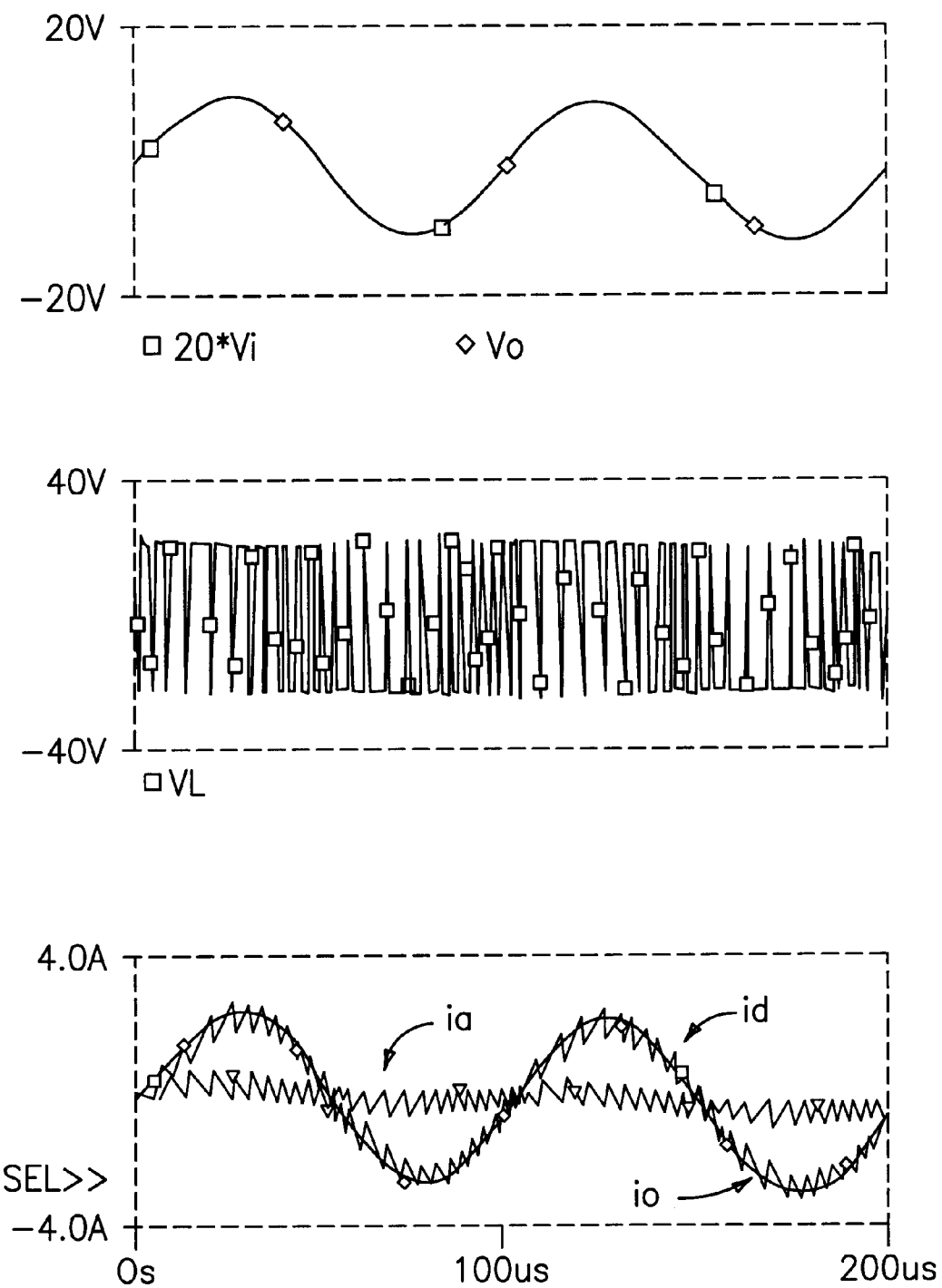
FIG. 4 is a graph showing simulation results of the audio amplifier according to the present invention.

FIG. 4 shows several simulated waveforms of the current $i_a$ supplied from the analog amplifier 10, the current $i_d$ supplied from the digital amplifier 20, and the current $i_0$ to the speaker 40. As shown in FIG. 4, almost all current $i_d$ of the current $i_0$ needed in the speaker 40 is supplied from the digital amplifier 20, whereas the analog amplifier 10 supplies only a small amount of ripple current or absorbs it.

The performance of the audio amplifier produced according to the present invention will be described.

The supply voltage $\pm V_{dd}$ is set to $\pm 22V_{dc}$ and $4\Omega$ load is used for the typical 50 W output. Since the input voltage $V_i$ is set to maximum $1V_p$, to obtain 50 W output$((=20/\sqrt{2})_2/4)$, it is necessary for the output voltage of $20V_p$. Thus, the closed loop gain is set to the about 20. And, the switching frequency of the digital amplifier 20 in the idle condition, in which no signal is applied to the input, is tuned-up around 250 kHz. The important elements for determining the switching frequency are as follows: inductor L, resistors R1 and R2, and a deadtime optionally added to the gate driver in the digital amplifier 20; impedance Z1 and Z2 in the analog amplifier 10; sensing resistor $R_s$ and gain of the amplifier 31 in the sensing circuit 30, etc.

Figure 5A:
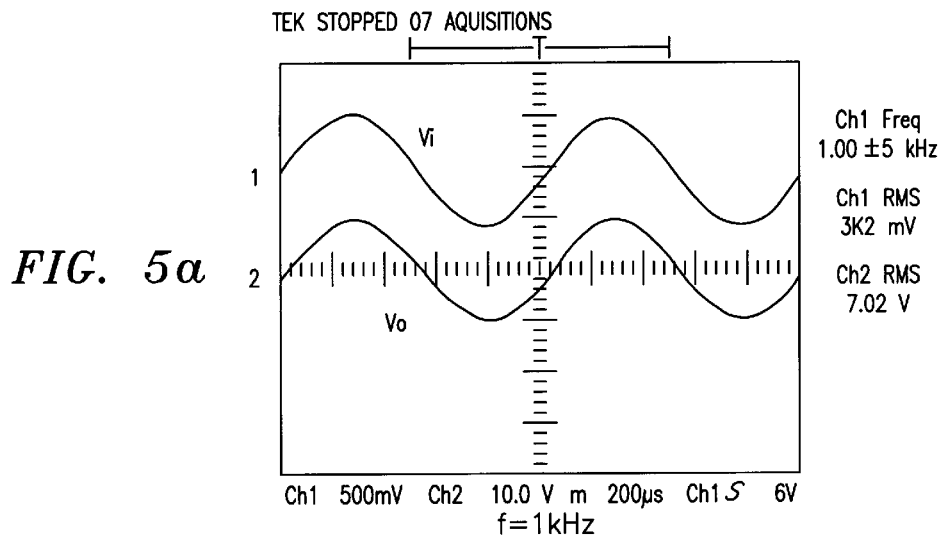
FIG. 5a to FIG. 5c show input/output waveform charts of the analog-digital combined audio amplifier shown in FIG. 2.
Figure 5B:
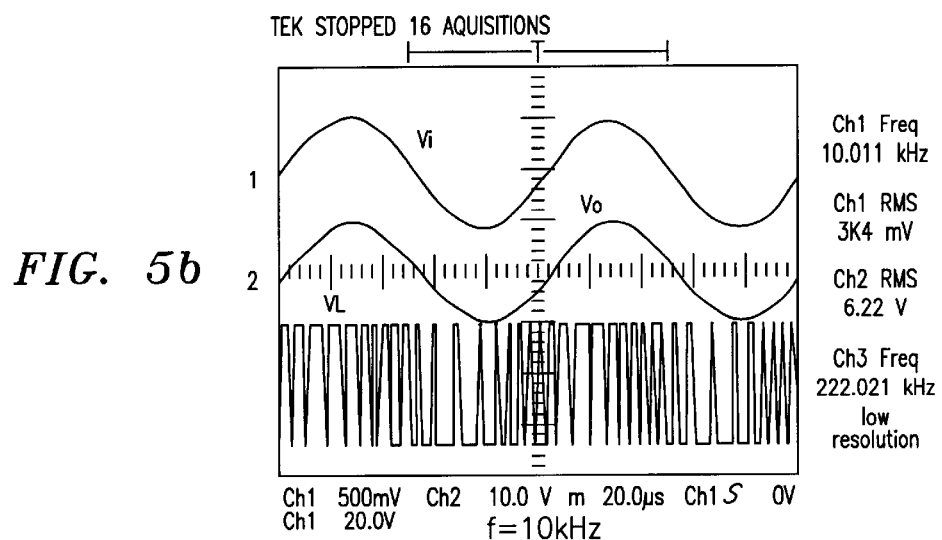
Figure 5C:
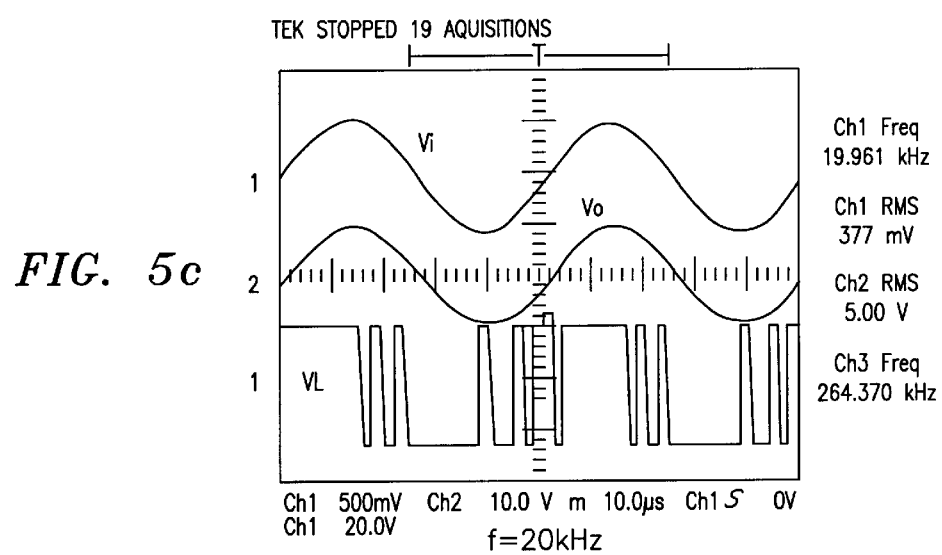

FIG. 5a to FIG. 5c show output waveforms $V_L$ of the digital amplifier 20 and output waveforms $V_O$ under the condition of the input signal $V_i$ with 0.5 $V_p$ sinusoidal waveforms in the 1 kHz, 10 kHz and 20 kHz, respectively.

Figure 6A:
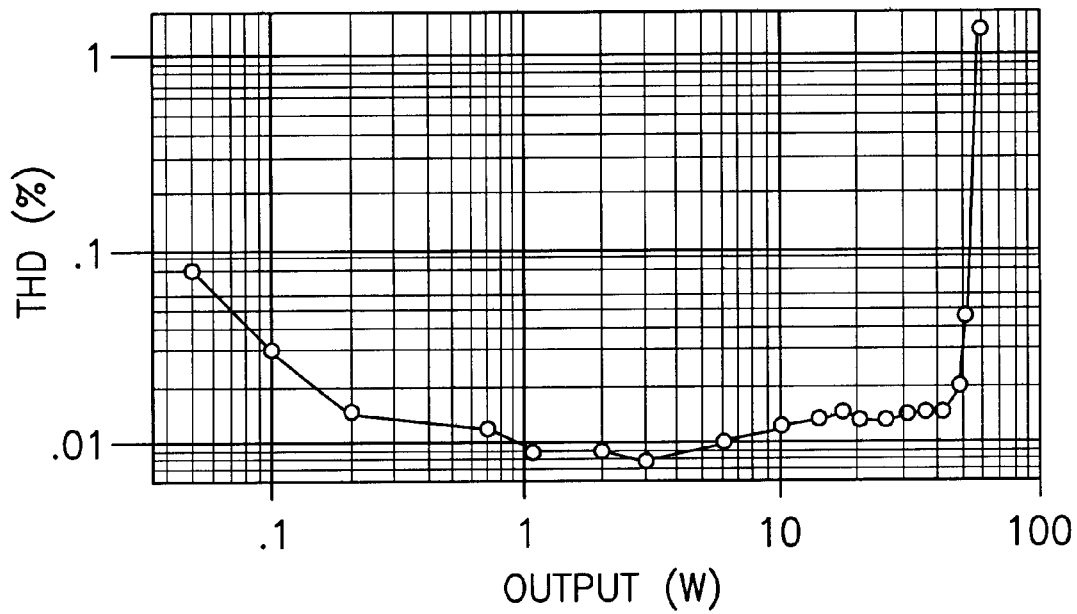
FIG. 6a and FIG. 6b are graphs showing total harmonic distortion characteristics of the combined audio amplifier according to the present invention, respectively.
Figure 6B:
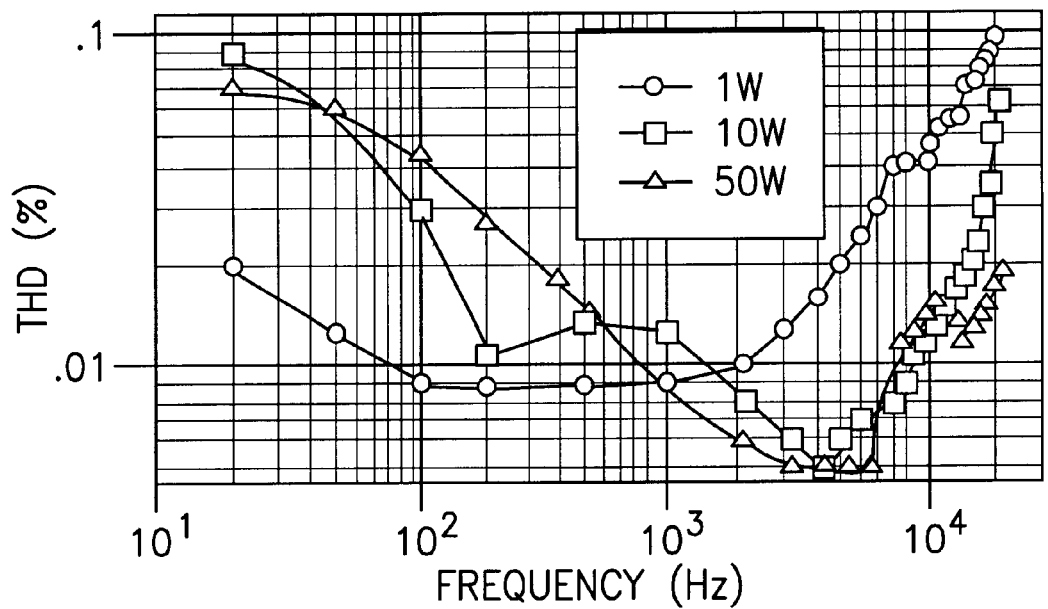

FIG. 6a shows a relationship between the rating output voltage and the total harmonic distortion(THD)in the 1 kHz and FIG. 6b shows a relationship between the frequency and the total harmonic distortion(THD) in the rating output of 1 W, 10 W and 50 W, respectively.

The total harmonic distortion at low level output is worse than that of at mid level output because the noise severely affects the signal at low level output. Also, the THD at extremely high level output is poor, because if the output signal $V_O$ is too large to cover with the supply voltage $\pm V_{dd}$, the clipping problem of the output signal abruptly arises from the $\pm V_{dd}$ limitation. As apparent from FIG. 6a and FIG. 6b, the THDs at 0.5 W to 50 W are about 0.01% and the THDs shows the most excellent characteristics in 500 Hz to 5 kHz covering the whole voice frequency band.

Figure 7A:
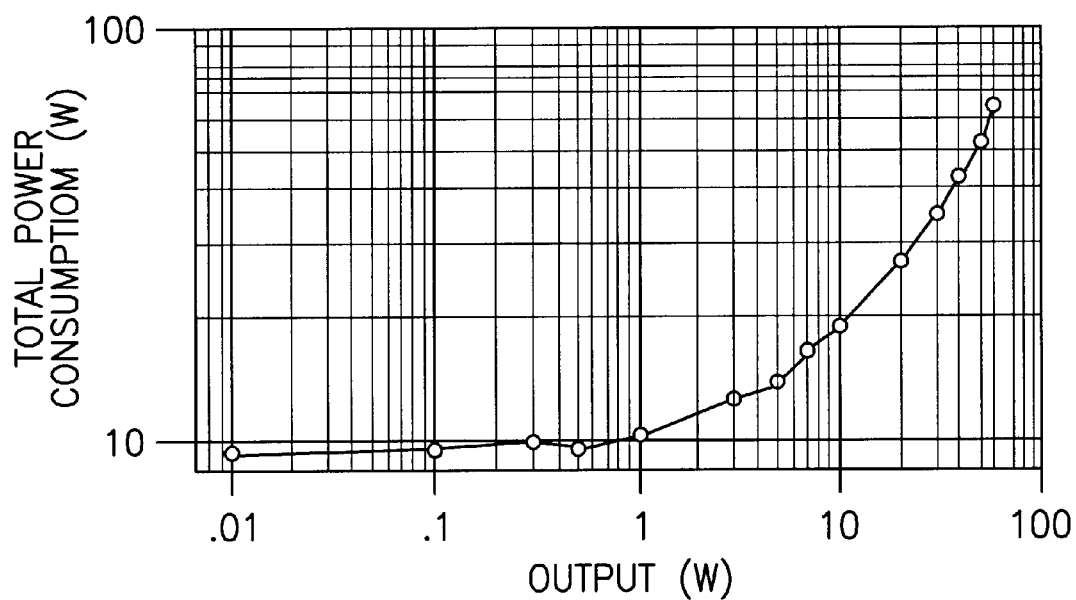
FIG. 7a and FIG. 7b are graphs showing efficiency characteristics of the combined audio amplifier according to the present invention, respectively.
Figure 7B:
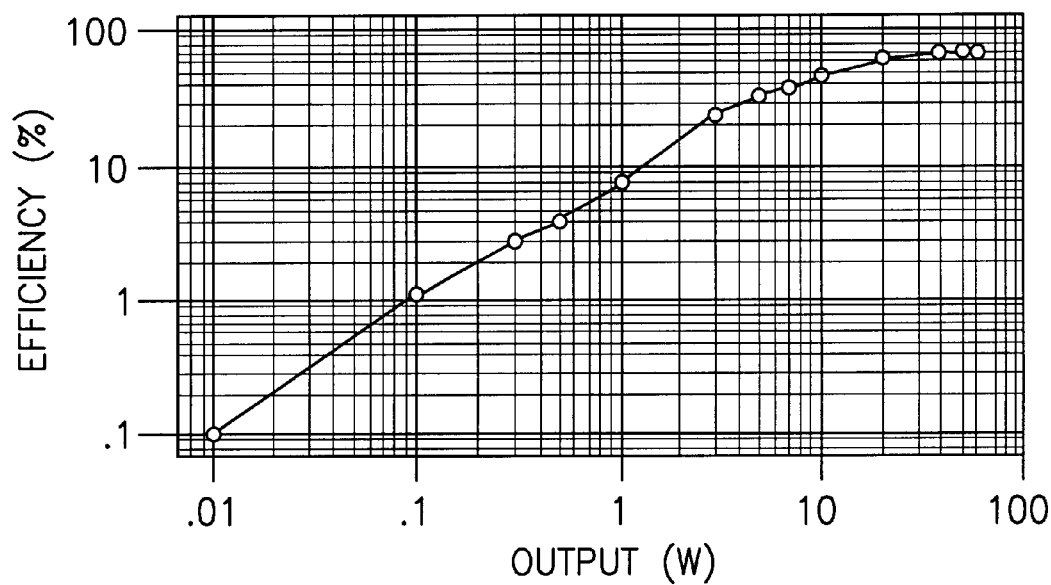

FIG. 7a shows a relationship between the rating output power and the total power consumption and FIG. 7b shows a relationship between the rating output power and the efficiency. The equation for calculating the power efficiency is given by $$\eta(x)=P_0(x)/P_{dd}(x) \tag{18}$$

where, $P_0(x)$, $P_{dd}(x)$ and x are the output power of speaker, total supplied power and arbitrary output level, respectively. From FIG. 7a and FIG. 7b, it is understood that the audio amplifier according to the present invention has the most excellent power efficiency characteristics around 90% at 50 W and is especially good for the high power application.

Figure 8A:
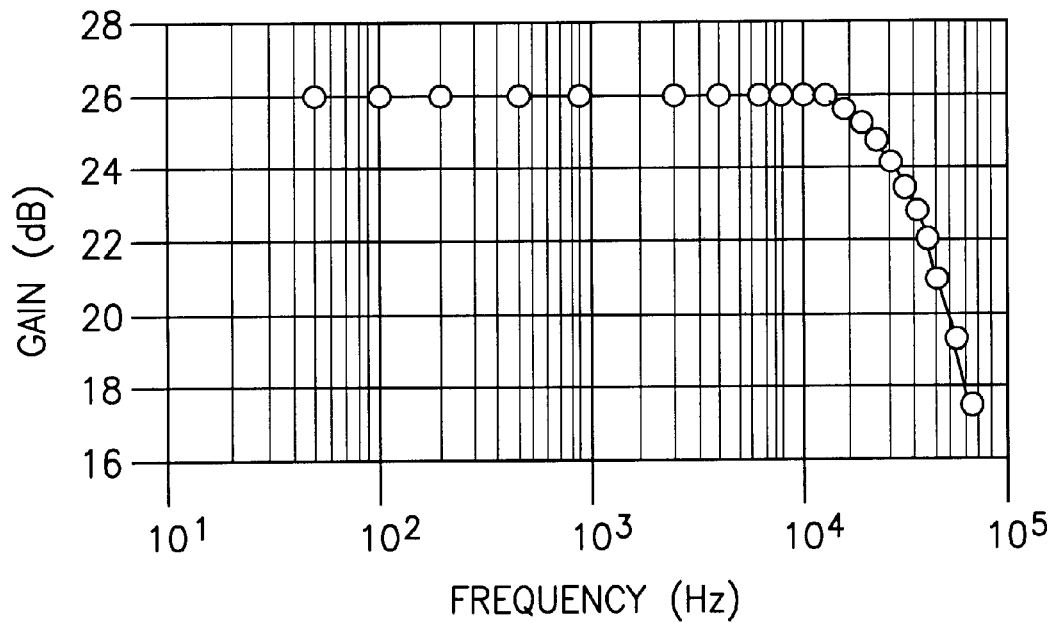
FIG. 8a and FIG. 8b are graphs showing frequency response characteristics curve of the combined audio amplifier according to the present invention, respectively.
Figure 8B:
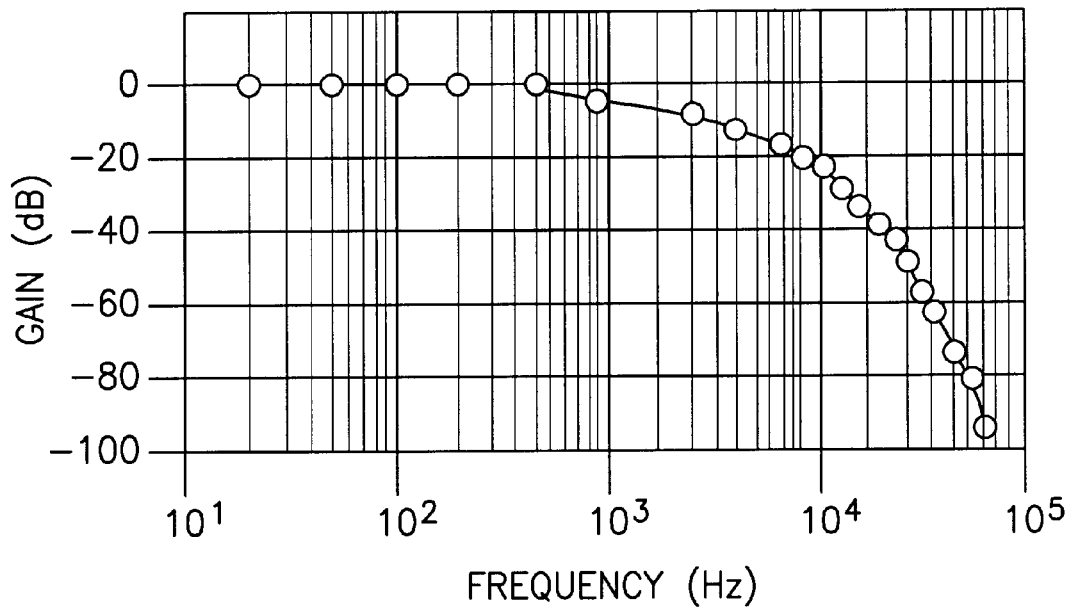

FIG. 8a and FIG. 8b show the frequency response characteristics, FIG. 8a shows the magnitude response, FIG. 8b shows the phase response, respectively.

As apparent from FIG. 8a and FIG. 8b, the magnitude response is very flat in the audible frequency of 20 Hz to 20 kHz and 3 dB bandwidth is located at around 40 kHz.

As mentioned above, the analog audio amplifier according to the present invention has both excellent linearity and high efficiency.

In particular, the present invention provides extraordinary energy saving effects by using the high efficiency digital amplifier combined with analog amplifier. In the case of 50 W power amplifier, conventional class A amplifiers, which have poor efficiency of about 20%, show the power loss of about 200 W. However, the power amplifier according to the present invention has the efficiency of 90% and more, so that power loss thereof is only about 5 W.

The analog-digital combined amplifier according to the present invention is described for the audio equipment application, but is not limited thereto. For example, the amplifier according to the present invention can be applied to the voltage source of power supply.

While the invention has been described with reference to a specific embodiment, the description is meant to be constructed in a limiting sense. Various modification of the disclosed embodiment, as well as other embodiment of the invention, will be apparent to persons skilled in the art upon reference to this description. It is therefore contemplated that the appended claims and their legal equivalents will cover any such modifications or embodiments which fall within the scope of the invention.

What is claimed is:

1. An analog-digital combined amplifier comprising:
   an analog amplifier serving as an independent voltage source;
   a digital amplifier serving as a dependent current source and
   a sensing block sensing current which is supplied from said analog amplifier or absorbed thereinto,
   wherein said sensing block comprises a sensing resistor connected in series between the analog amplifier and a load for sensing the current supplied from the analog amplifier or absorbed thereinto and converting the current into a voltage component; and an amplifier for amplifying the voltage sensed by said resistor.

2. An analog-digital combined amplifier according to claim 1, wherein said sensing resistor ($R_s$) has a value which is in the range of about 0.01Ω to about10Ω.

3. An analog-digital combined amplifier according to claim 1, wherein said analog amplifier comprises a basic amplifier; a base driver for controlling the operation of transistors; a pair of transistors constituting the push-pull stage; and a feedback means composed of passive elements for determining the closed-loop of a whole system.

4. An analog-digital combined amplifier according to claim 1, wherein said digital amplifier comprises a comparator which is input by output voltage of the sensing block, excluding shoot through caused by mismatching of gains, increase and decrease characteristics of a plurality of comparators.

5. An analog-digital combined amplifier according to claim 4, wherein said digital amplifier comprises resistors ($R_1$, $R_2$) and a pull-up resistor ($R_3$) for determining the hysteresis voltage of said comparator; a gate driver; high power switches constituting output stage; and an inductor.

6. An analog-digital combined amplifier according to claim 5, wherein said inductor has a value which is in the range of about 10 $\mu$H to about 500 $\mu$H.

7. An analog-digital combined amplifier according to claim 1, wherein said analog amplifier (10) and digital amplifier (20) are connected together such that an output (Vo') of said analog amplifier (10) serving as an independent voltage source, and an output ($i_d$) of said digital amplifier (20) serving as a dependent current source, are connected in parallel to one another, thus providing both low distortion and low power consumption and with the parallel linkage between the analog amplifier (10) and digital amplifier (20) giving no problem.

8. An analog-digital combined amplifier according to claim 7, wherein said analog amplifier (10) is connected upstream of said resistor (Rs) in said sensing block (30).

9. An analog-digital combined amplifier according to claim 8, structured and arranged such that said digital amplifier (20) supplies a large amount of current ($i_d$) to a speaker (40) for generating audio sound.

10. An analog-digital combined amplifier according to claim 9, wherein said analog amplifier (10) comprises a basic amplifier (11), a base driver (12) for controlling the operation of transistors (Q1, Q2), a pair of transistors (Q1,Q2) constituting the push-pull stage, and a feedback means (15) composed of passive elements (Z1, Z2) for determining the closed-loop of a whole system.

11. An analog-digital combined amplifier according to claim 10, wherein said digital amplifier (20) comprises resistors ($R_1$, $R_2$) and a pull-up resistor ($R_3$) for determining the hysteresis voltage of a comparator (21), a gate driver (22), and a pair of high power switches (M1, M2) constituting an output stage, and an inductor (L).

12. An analog-digital combined amplifier according to claim 11, structured and arranged such that when current ($i_a$) flows from said analog amplifier (10) possessing excellent distortion characteristics but exhibiting poor efficiency to the speaker (40), most of current ($i_d$) of current ($i_o$) required in said speaker (40) is supplied from said digital amplifier (20) which possesses high efficiency, while said analog amplifier (10) supplies only a small amount of ripple current or rapidly absorbs an excessive current ($i_a$), such that high fidelity and high efficiency are simultaneously attained.

13. An analog-digital combined amplifier according to claim 12, wherein said digital amplifier (20) comprises said comparator (21) being input by output voltage (Vs) of said sensor block (30), excluding shoot through caused by mismatching of gains, increase and decrease characteristics of a plurality of comparators.

* * * * *